(12) United States Patent
Perner et al.

(10) Patent No.: US 6,643,213 B2
(45) Date of Patent: Nov. 4, 2003

(54) WRITE PULSE CIRCUIT FOR A MAGNETIC MEMORY

(75) Inventors: Frederick A. Perner, Palo Alto, CA (US); Manoj Bhattacharyya, Cupertino, CA (US)

(73) Assignee: Hewlett-Packard Development Company, L.P., Hosuton, TX (US)

( * ) Notice: Subject to any disclaimer, the term of this patent is extended or adjusted under 35 U.S.C. 154(b) by 0 days.

(21) Appl. No.: 10/096,542

(22) Filed: Mar. 12, 2002

(65) Prior Publication Data

US 2003/0174574 A1 Sep. 18, 2003

(51) Int. Cl.[7] .............................. G11C 8/00; G11C 7/00
(52) U.S. Cl. ................ 365/230.06; 365/204; 365/243.5
(58) Field of Search .............................. 365/97, 189.04, 365/189.09, 204, 209, 230.06, 243.5

(56) References Cited

U.S. PATENT DOCUMENTS

| | | | | |
|---|---|---|---|---|
| 3,651,490 A | * | 3/1972 | Onoda et al. ................ | 365/184 |
| 3,846,769 A | * | 11/1974 | Shepherd ............... | 365/230.07 |
| 6,111,783 A | | 8/2000 | Tran et al. | |
| 6,256,224 B1 | | 7/2001 | Perner et al. | |

* cited by examiner

*Primary Examiner*—Thong Le

(57) ABSTRACT

A magnetic memory includes a memory cell and a conductor wherein the memory cell is crossed by the conductor. A write pulse generator is coupled to the conductor and is configured to provide a discharge current to the conductor during a write operation of the memory cell.

16 Claims, 6 Drawing Sheets

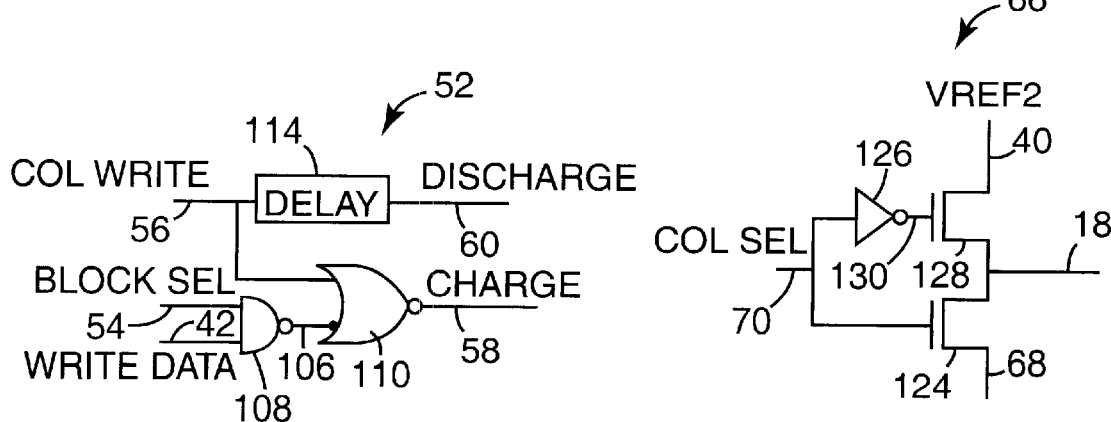
Fig. 5a
Fig. 5b
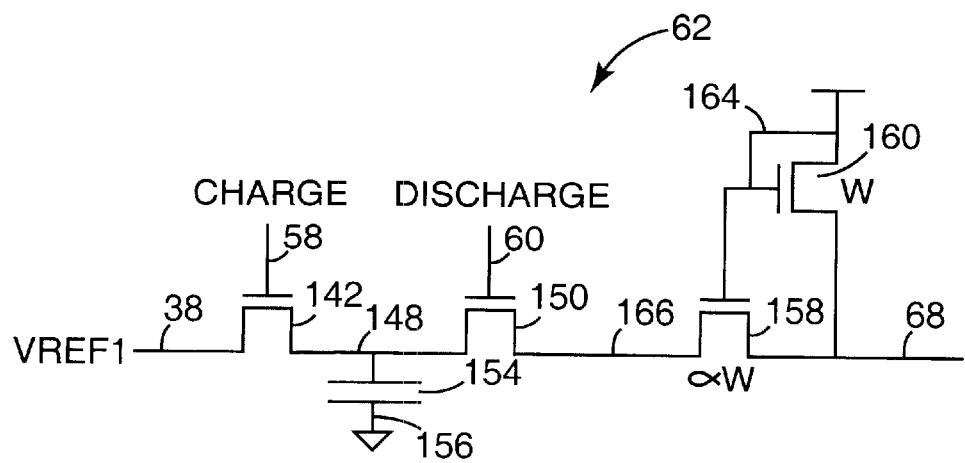
Fig. 6a

WRITE PULSE CIRCUIT FOR A MAGNETIC MEMORY

THE FIELD OF THE INVENTION

The present invention generally relates to the field of magnetic memories. More particularly, the present invention relates to a write pulse generator device and method for a magnetic memory wherein the write pulse generator is coupled to a conductor which crosses the memory cell and is configured to provide a discharge current to the conductor during a write operation of the memory cell to improve the write performance of the magnetic memory.

BACKGROUND OF THE INVENTION

Magnetic random access memory (MRAM) is a type of non-volatile magnetic memory which includes magnetic memory cells. A typical magnetic memory cell includes a layer of magnetic film in which the magnetization of the magnetic film is alterable and a layer of magnetic film in which magnetization is fixed or "pinned" in a particular direction. The magnetic film having alterable magnetization is typically referred to as a data storage layer, and the magnetic film which is pinned is typically referred to as a reference layer.

A magnetic memory cell is usually written to a desired logic state by applying external magnetic fields that rotate the orientation of magnetization in its data storage layer. The logic state of a magnetic memory cell is indicated by its resistance which depends on the relative orientations of magnetization in its data storage and reference layers. The magnetization orientation of the magnetic memory cell assumes one of two stable orientations at any given time. These two stable orientations, parallel and anti-parallel, represent, for example, logic values of "0" and "1."

Typically, the orientation of magnetization in the data storage layer aligns along an axis of the data storage layer that is commonly referred to as its easy axis. The external magnetic fields are applied to flip the orientation of magnetization in the data storage layer along its easy axis to either a parallel or anti-parallel orientation. With parallel orientation, the magnetic memory cell is in a low resistance state because the orientation of magnetization in its data storage layer is substantially parallel along the easy axis. With anti-parallel orientation, the magnetic memory cell is in a high resistance state because the orientation of magnetization in its data storage layer is substantially anti-parallel along the easy axis.

A typical magnetic memory includes an array of magnetic memory cells. Word lines extend along rows of the magnetic memory cells, and bit lines extend along columns of the magnetic memory cells. Each magnetic memory cell is located at an intersection of a word line and a bit line. A selected magnetic memory cell is usually written by applying electrical currents to the particular word and bit lines that intersect at the selected magnetic memory cell. The electrical current applied to the particular bit line generates a magnetic field substantially aligned along the easy axis of the selected magnetic memory cell. This magnetic field may be referred to as a bit line write field. An electrical current applied to the particular word line also generates a magnetic field substantially perpendicular to the easy axis of the selected magnetic memory cell. This magnetic field may be referred to as a word line write field. The sum of the bit line write field and the word line write field must be greater than a write threshold to enable the magnetization in the data storage layer to change and align according to the applied write fields. A magnetic memory cell receiving only the word line or the bit line write field is termed a "half-selected" magnetic memory cell. The magnitudes of the word line and bit line write fields are usually chosen to be high enough so that the magnetization in the data storage layer of the selected magnetic memory cell changes and aligns according to the applied write fields, but not too high so that the half-selected magnetic memory cells which are subject to either the word line or the bit line write field do not change their direction of magnetization in the data storage layer.

Data is typically written to the MRAM array as n-bit words. For example, a 16-bit word might be written to sixteen memory cells by supplying a write current to a word line crossing the sixteen memory cells and supplying separate write currents to the sixteen bit lines crossing the sixteen memory cells. Peak currents can be especially high for highly parallel modes of operation, such as for 64-bit wide or 128-bit wide operations. With these modes, data can be written to 64 or 128 memory cells by supplying a single word line current and 64 or 128 separate bit line currents to each of the bit lines crossing the magnetic memory cells.

One problem that can occur during the highly parallel modes of operation is high peak write currents. High peak write currents can create unacceptable levels of current noise which can degrade the write performance of the MRAM arrays. High peak write currents also can reduce reliability as a result of electromigration occurring in the metal interconnect layers which route read and write control circuitry to the memory cell array.

Another problem that can occur is difficulty in controlling the write currents to a specified range to write the individual magnetic memory cells in the array. A selected magnetic memory cell receives both the word line and the bit line write fields. With high peak write currents, it can become more difficult to control the write currents to a level high enough to write the selected magnetic memory cell but not so high that half-select switching occurs.

Manufacturing variation among the magnetic memory cells can also increase the difficulty in controlling the write currents to a specified range. For example, manufacturing variation in the dimensions or shapes of the magnetic memory cells may increase the likelihood of half-select switching. Furthermore, variation in the thicknesses or in the crystalline anisotropy of the data storage layers of the magnetic memory cell may also increase the likelihood of half-select switching.

SUMMARY OF THE INVENTION

The present invention is a write pulse generator device and method for a magnetic memory. The magnetic memory includes a memory cell and a conductor wherein the conductor crosses the memory cell. The write pulse generator is coupled to the conductor and is configured to provide a discharge current to the conductor during a write operation of the memory cell.

BRIEF DESCRIPTION OF THE DRAWINGS

FIGS. 5a and 5b are diagrams illustrating one exemplary embodiment of a write control circuit and a switch circuit.

FIG. 6a is a schematic diagram illustrating one exemplary embodiment of a write pulse generator circuit.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
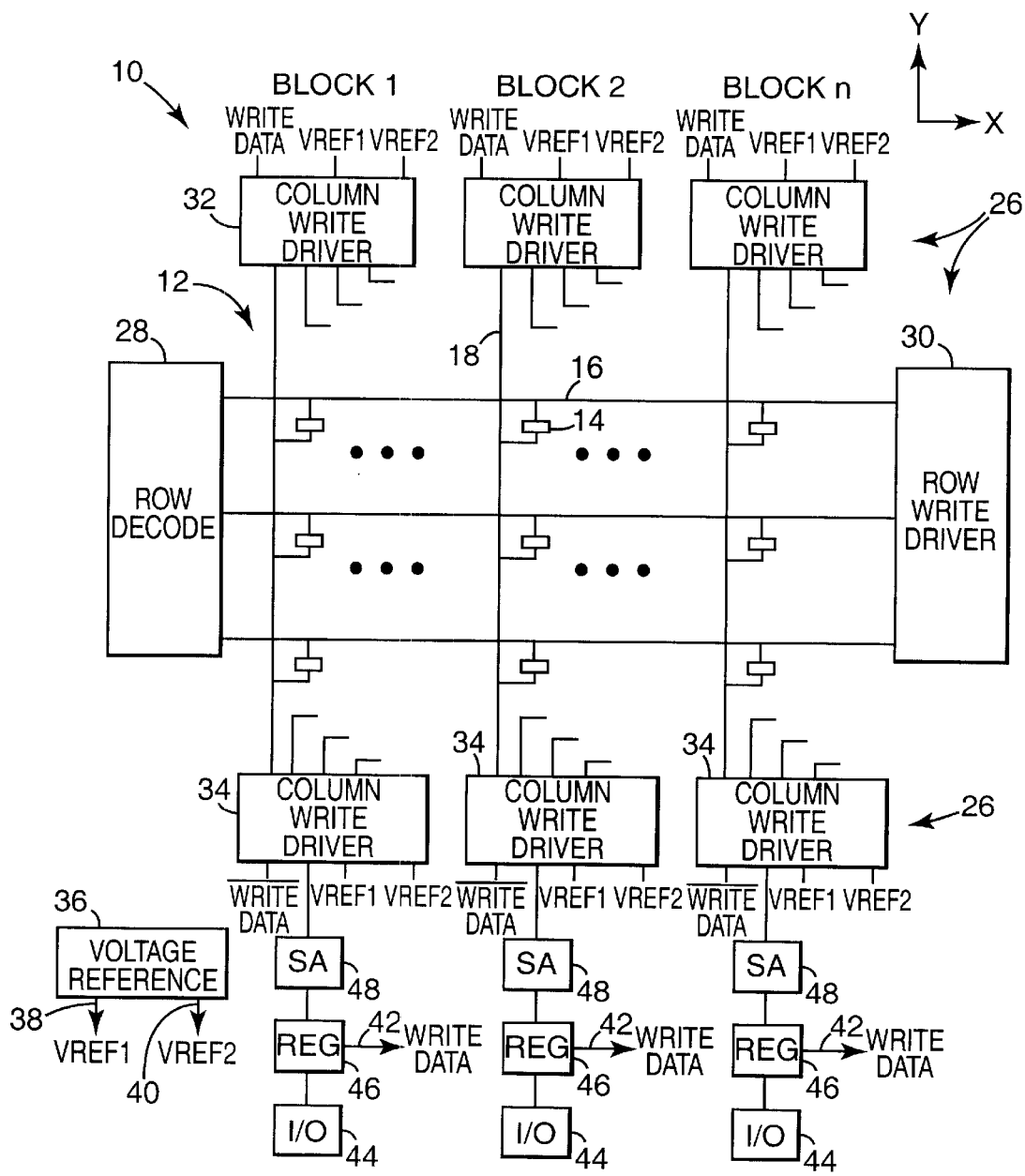
FIG. 1 is a diagram illustrating one exemplary embodiment of a magnetic memory according to the present invention.

FIG. 1 is a diagram illustrating one exemplary embodiment of a magnetic memory according to the present invention. In magnetic memory 10, a write pulse generator is coupled to one or more conductors and provides a discharge current to a selected one of the one or more conductors during a write operation to improve the write performance of the magnetic memory. The magnetic memory cells 14 are arranged in rows and columns, with the rows extending along an x-direction and the columns extending along a y-direction. Only a relatively small number of magnetic memory cells 14 are shown to simplify the description of the invention. In other embodiments, the array 12 is any suitable size. In other embodiments, the array 12 may utilize highly parallel modes of operation, such as 64-bit wide or 128-bit wide operation.

In one embodiment, word lines 16 extend along the x-direction in a plane on one side of array 12 and bit lines 18 extend along the y-direction in a plane on an opposite side of array 12. In one embodiment, there is one word line 16 for each row of array 12 and one bit line 18 for each column of array 12. In the embodiment illustrated in FIG. 1, magnetic memory cell 14 is located at an intersection or cross point of a word line 16 and a bit line 18.

The magnetic memory cells 14 are not limited to any particular type of device. In one embodiment, magnetic memory cells 14 are spin dependent tunneling ("SDT") junction devices. In alternative embodiments, other types of magnetic memory cells are formed which include, but are not limited to, anisotropic magnetoresistance devices, giant magnetoresistance devices, colossal magnetoresistance devices, extraordinary magnetoresistance devices or very large magnetoresistance devices.

In one embodiment, magnetic memory 10 further includes a write circuit 26 and a row decode circuit 28. In one embodiment, the write circuit 26 performs write operations on selected magnetic memory cells 14. The write circuit 26 includes a row write driver 30, column write drivers 32, column write drivers 34 and a voltage reference 36. The voltage reference 36 provides a first voltage reference (VREF1) at 38 and a second voltage reference (VREF2) at 40 to column write drivers 32 and column write drivers 34.

In one embodiment, row write driver 30, column write drivers 32 and column write drivers 34 supply write currents Ix and Iy to selected word and bit lines 16 and 18 during a write operation on a selected magnetic memory cell 14. Each pair of column write drivers 32 and 34 supply a bit line write current to a block (i.e., multiple columns) of magnetic memory cells 14. Different pairs of column write drivers 32 and 34 provide bit line currents to different blocks of magnetic memory cells 14. At any given time, the column write drivers 32 and 34 write to only a single magnetic memory cell 14 in a block. In various embodiments, column write drivers 32 and 34 will drive significantly more current than row write driver 30.

In one example embodiment, in an array 12 having n=16 blocks of memory cells and sixteen pairs of column drivers 32 and 34, bit line currents will be supplied to 16 bit lines during a write operation. In this example embodiment, word and bit line write currents of one milliamp are sufficient to set the magnetization orientation of each magnetic memory cell 14. Writing to all 16 blocks will result in a row word line write current of one milliamp and a column bit line write current of 16 milliamps. If in other embodiments n is a larger number, for example, if n=32 or n=128, the column bit line currents will be 32 milliamps or 128 milliamps, both of which are much larger than the row word line current.

In one embodiment, data to be written to magnetic memory cells 14 is supplied to magnetic memory 10 via I/O pads 44 and stored in data registers 46. While only one data register 46 per I/O pad 44 is illustrated, in other embodiments, magnetic memory 10 can include multiple data registers 46 per I/O pad 44, whereby data would be supplied serially to an I/O pad 44 and de-multiplexed into different data registers 46. The data from data registers 46 is provided to column write drivers 32 and column write drivers 34. Logic within column write drivers 32 and 34 determines the state of the data, and, depending on the state, either column write driver 32 or column write driver 34 will provide bit line currents to selected magnetic memory cells 14.

In one embodiment, during a read mode of operation on a selected magnetic memory cell 14, row write driver 30 and column write driver 34 supply a sense current to the selected magnetic memory cell 14. Sense amplifiers 48 sense the resistance state of selected magnetic memory cell 14 to determine the logic value stored in selected magnetic memory cell 14. In one embodiment, sense amplifier 48 can measure the sense current to determine whether the memory cell has a resistance of value R corresponding to one logic state or a value R+ΔR corresponding to a second logic state. Corresponding data values are stored in data registers 46. The values stored in data registers 46 are read out of magnetic memory 10 via I/O pads 44.

Figure 2A:
FIGS. 2a and 2b are diagrams illustrating parallel and anti-parallel magnetization of a magnetic memory cell.
Figure 2B:
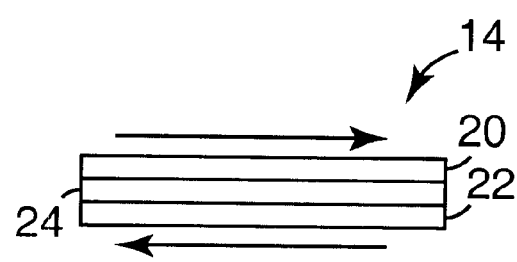

FIGS. 2a and 2b are diagrams illustrating parallel and anti-parallel magnetization of a magnetic memory cell. In one embodiment, magnetic memory cell 14 is a spin dependent tunneling device. Magnetic memory cell 14 includes a magnetic layer referred to as data storage layer 20, a magnetic layer referred to as reference layer 22, and a tunnel barrier 24 disposed between data storage layer 20 and reference layer 22. Data storage layer 20 is referred to as a "free" layer because it has a magnetization orientation that is not pinned and which can be oriented in either of two directions along the easy axis which lies in a plane. Reference layer 22 is referred to as a "pinned" layer because it has a magnetization that is oriented in a plane but is fixed so as not to rotate in the presence of an applied magnetic field within a range of interest. FIG. 2a illustrates by arrows a "parallel" orientation when the magnetization of the free and pinned layers 20 and 22 are in the same direction. FIG. 2b illustrates by arrows an "anti-parallel" orientation when the magnetization of the free and pinned layers 20 and 22 are in opposite directions.

The insulating tunnel barrier 24 allows quantum mechanical tunneling to occur between the free and pinned layers. This tunneling phenomenon is electron spin dependent, making the resistance of the spin dependent tunneling device a function of the relative orientations of the magnetization of the free and pinned layers 20 and 22. The resistance of magnetic memory cells 14 is a first value R if the orientation of magnetization of the free and pinned layers 20 and 22 is parallel as illustrated in FIG. 2a. The resistance of magnetic memory cell 14 is increased to a second value R+ΔR when the orientation of magnetization is changed from parallel to anti-parallel as illustrated in FIG. 2b.

Data is stored in magnetic memory cell 14 by orienting the magnetization along the easy axis of free layer 20. In one embodiment, a logic value of "0" is stored in magnetic memory cell 14 by orienting the magnetization of free layer 20 such that the magnetization orientation is parallel, and a logic value of "1" is stored in magnetic memory cell 14 by orienting the magnetization of free layer 20 such that the magnetization orientation is anti-parallel. In another embodiment, a logic value of "1" is stored in magnetic memory cell 14 by orienting the magnetization of free layer 20 such that the magnetization orientation is parallel, and a logic value of "0" is stored in magnetic memory cell 14 by orienting the magnetization of free layer 20 such that the magnetization orientation is anti-parallel.

Figure 3:
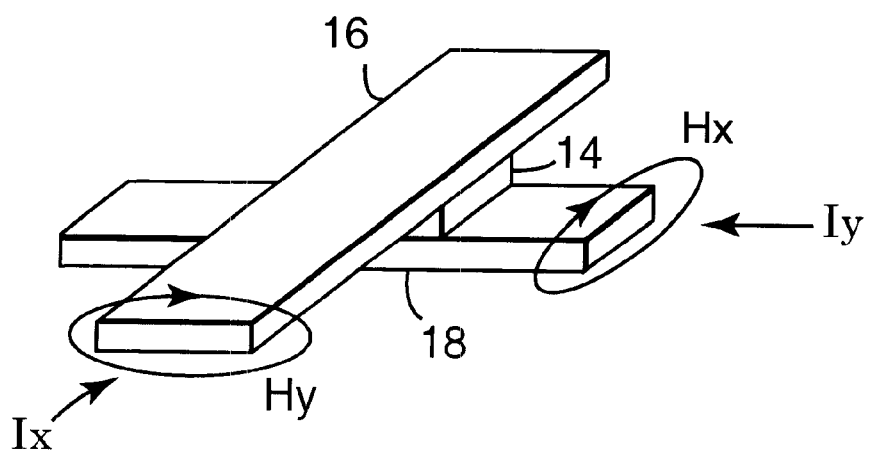
FIG. 3 is a diagram illustrating a magnetic memory cell that has been selected during a write operation.

FIG. 3 is a diagram illustrating a magnetic memory cell that has been selected during a write operation. In one embodiment, the magnetization in free layer 20 of selected magnetic memory cell 14 is oriented by supplying the currents Ix and Iy to conductors 16 and 18 which cross selected magnetic memory cell 14. Supplying the current Ix to word line 16 causes a magnetic field Hy to form around conductor 16. Supplying the current Iy to bit line 18 causes a magnetic field Hx to form around bit line 18. When sufficiently large currents Ix and Iy are passed through word line 16 and bit line 18, the magnetic fields Hx and Hy in the vicinity of free layer 20 causes the magnetization of free layer 20 to rotate from the parallel orientation to the anti-parallel orientation, or to rotate the anti-parallel orientation to the parallel orientation. The currents Ix and Iy are selected so that the combined magnetic fields Hx and Hy are sufficient to rotate the orientation of free layer 20, but not too high so as to cause either pinned layer 22 or free layer 20 of half-selected magnetic memory cells to rotate their orientation.

Figure 4:
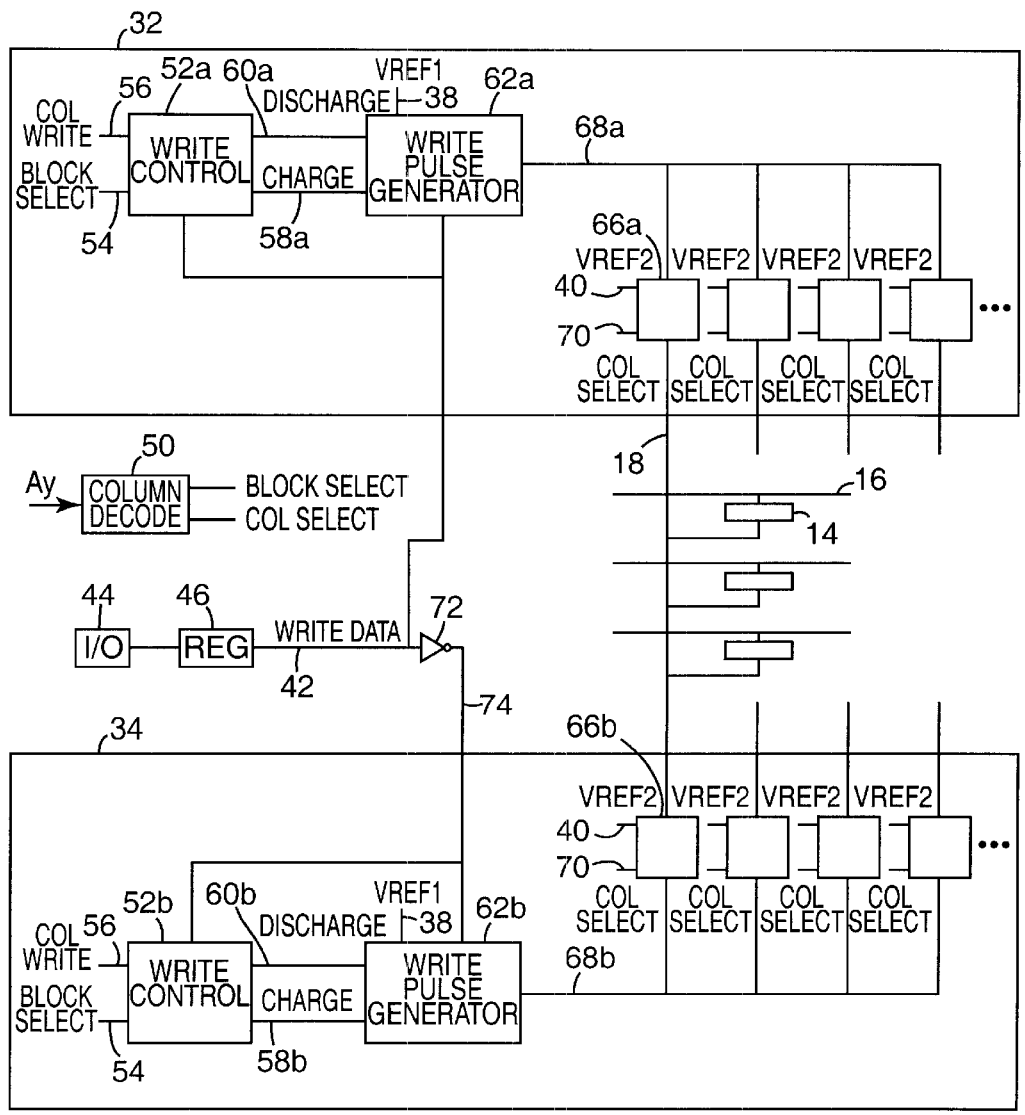
FIG. 4 is a diagram illustrating one exemplary embodiment of column write drivers and a portion of an array of magnetic memory cells.

FIG. 4 is a diagram illustrating one exemplary embodiment of column write drivers and a portion of an array of magnetic memory cells. In the illustrated embodiment, column write driver 32 and column write driver 34 are both coupled to bit lines 18 to supply a bit line current in two directions. In other embodiments, column write driver 32 and column write driver 34 are coupled to word lines 16 to supply a word line current in two directions.

In one embodiment, the column write driver 32 illustrated in FIG. 4 is selected to supply a write current. Column decode 50 decodes an address Ay which selects the column write driver 32 and 34 block and selects a column within the column write driver 32 and 34 block. Write control 52a receives a block select signal at input 54, a column write signal at input 56, and a write data signal at input 42. Write control 52a decodes the block select signal at 54 to determine if the block corresponding to column write driver 32 and 34 is selected and decodes the write data signal at 42 to determine if column write driver 32 or column write driver 34 is providing the write current. Write control 52a provides a "charge" output at 58a and a "discharge" output at 60a which are both coupled to write pulse generator 62a. Write control 52a controls a write current pulse generated by write pulse generator 62a via the charge output 58a and the discharge output 60a. Write pulse generator 62a also has a write data input signal at 42.

When column write driver 32 is block selected by the block select signal at 54 and is selected by the write data signal at 42 to supply the write current, write control 52a initializes write pulse generator 62a via charge 58a to initiate a charge of a capacitor controlled by write pulse generator 62a. The voltage reference VREF1 is provided at input 38 of write pulse generator 62a. When the charge of the capacitor is initiated, write pulse generator 62a couples the capacitor to the voltage reference VREF1 to charge the capacitor to the voltage level of VREF1. In various embodiments, the level of VREF1 is preselected to suitable levels as desired to set the maximum charge voltage level of the capacitor. When a selected magnetic memory cell 14 is to be written, write control 52a enables a discharge of the capacitor at discharge 60a to discharge the capacitor to output 68a.

Column decode 50 provides column select signals to column select switches 66a so that the particular column with the selected memory cell 14 can be selected by decoding the address Ay. Selected switch 66a couples bit line 18 corresponding to selected magnetic memory cell 14 to output 68a of write pulse generator 62a so that the write pulse generated by discharging the capacitor is coupled to selected magnetic memory cell 14. The other end of bit line 18 corresponding to selected memory cell 14 is coupled through selected switch 66b to output 68b of write pulse generator 62b which is at ground potential. Other unselected switches 66a couple unselected bit lines 18 to the voltage reference VREF2 at 40. Furthermore, other unselected switches 66b couple the other ends of unselected bit lines 18 to the voltage reference VREF2 at 40. In one embodiment, VREF2 is zero volts or ground potential. In other embodiments, VREF2 is other suitable potentials.

In one embodiment, the column write driver 34 illustrated in FIG. 4 is selected to supply a write current. Column decode 50 decodes an address Ay which selects the column write driver 32 and 34 block and select a column within the column write driver 32 and 34 block. Write control 52b receives the block select signal at input 54, the column write signal at input 56, and the inverted write data signal at input 74. The write data signal from register 46 is inverted for column write driver 34 so that only one of column write driver 32 or column write driver 34 is selected to supply the write current. Write control 52b decodes the block select signal at 54 to determine if the column write driver 32 and 34 block is selected and decodes the inverted write data signal at input 74 to determine if column write driver 32 or column write driver 34 is providing the write current. Write control 52b provides a "charge" output at 58b and a "discharge" output at 60b which are both coupled to write pulse generator 62b. Write control 52b controls a write current pulse generated by write pulse generator 62b via the charge output at 58*b* and the discharge output at 60*b*. Write pulse generator 62*b* also has a write data input signal at 42.

When column write driver 34 is block selected by the block select signal at 54 and is selected by the inverted write data signal at 74 to supply the write current, write control 52*b* initializes write pulse generator 62*b* via charge 58*b* to initiate a charge of a capacitor controlled by write pulse generator 62*b*. The voltage reference VREF1 is provided at input 38 of write pulse generator 62*b*. When the charge of the capacitor is initiated, write pulse generator 62*b* couples the capacitor to the voltage reference VREF1 to charge the capacitor to the voltage level of VREF1. In various embodiments, the level of VREF1 is preselected to suitable levels as desired to set the maximum charge voltage level of the capacitor. When a selected magnetic memory cell 14 is written, write control 52*b* enables a discharge of the capacitor at discharge 60*b* to discharge the capacitor to output 68*b*.

Column decode 50 provides column select signals to column select switches 66*b* so that the particular column with the selected memory cell 14 can be selected by decoding the address Ay. Selected switch 66*b* couples bit line 18 corresponding to selected magnetic memory cell 14 to output 68*b* of write pulse generator 62*b* so that the write pulse generated by discharging the capacitor is coupled to selected magnetic memory cell 14. The other end of bit line 18 corresponding to selected memory cell 14 is coupled through selected switch 66*a* to output 68*a* of write pulse generator 62*a* which is at ground potential. Other unselected switches 66*b* couple unselected bit lines 18 to the voltage reference VREF2 at 40. Furthermore, other unselected switches 66*a* couple the other ends of unselected bit lines 18 to the voltage reference VREF2 at 40. In one embodiment, VREF2 is zero volts or ground potential. In other embodiments, VREF2 is other suitable potentials.

FIGS. 5*a* and 5*b* are diagrams illustrating exemplary embodiments of write control 52 and select switches 66. For ease of discussion, the reference to logical "0" and logical "1" refers to Complimentary Metal-Oxide Semiconductor (CMOS) low and high voltage switching levels respectively.

In one embodiment, write control 52 has a block select input at 54, a column write input at 56 and a write data input at 42. The block select input at 54 and the write data input at 42 are both inputs to NAND gate 108. When write control circuit 52 is selected to provide the write current, the block select input at 54 and the write data input at 42 are both at a logical "1" and the output of NAND gate 108 at line 106 is at a logical "0". Because the column write input at 56 is also at a logical "0", the "charge" output 58 of NOR gate 110 switches to a logical "1" and initiates the charging of the capacitor within write pulse generator 62.

When the selected magnetic memory cell 14 is written, the write is initiated at the column write input at 56 by switching the column write input at 56 from a logical "0" to a logical "1". This switches the output 58 of NOR gate 110 to a logical "0" and terminates the charging of the capacitor within the write pulse generator circuit 62. The column write input at 56 is also coupled to delay element 114. The output 60 of delay element 114 is coupled to the write pulse generator to initiate the write by discharging the capacitor to write the selected magnetic memory cell 14. The purpose of the delay function is to delay the discharge initialization signal at output 60 in order to provide time for write pulse generator 62 to decouple the capacitor from VREF1 before the capacitor is discharged to write the selected memory cell bit 14. The delay function provided by delay 114 can be provided by any suitable means. In one embodiment, the delay is provided by an even number of logic gates.

In other embodiments, write control 52 is implemented using various suitable approaches. In one embodiment, the capacitor is continuously coupled to VREF1 and is decoupled only while the discharge is occurring. In other embodiments, the capacitor is charged at suitable predetermined times before the selected memory cell 14 is desired to be written.

FIG. 5*b* is a diagram illustrating one exemplary embodiment of a switch circuit. In one embodiment, switch circuit 66 has a column select input at 70. The column select input 70 selects whether bit line 18 is coupled to VREF2 at 40 or is coupled to the write pulse generator 62 output at 68.

When the column within the particular block is selected, the column select input at 70 is switched to a logical "1" which turns off n-channel transistor 128 by switching the output of inverter 126 at 130 to a logical "0" which decouples bit line 18 from VREF2 at 40. When the column select input at 70 is switched to a logical "1", n-channel transistor 124 is turned on and couples bit line 18 to the output of the write pulse generator 62 at 68. In one embodiment, the n-channel transistors are formed using a CMOS process. When the column within the particular block is not selected, the column select input at 70 is at a logical "0" which turns off n-channel transistor 124 to decouple bit line 18 from the output of the write pulse generator 62 at 68 and turns on n-channel transistor 128 to couple bit line 18 to VREF2 at 40.

In other embodiments, select circuits 66 are implemented using various suitable approaches which couple an end of bit line 18 to either VREF2 or an output of write pulse generator 62 at 68.

FIG. 6*a* is a schematic diagram illustrating one exemplary embodiment of a write pulse generator circuit. In the embodiment illustrated in FIG. 6*a*, n-channel transistor 142 functions as a switch to initiate the charging and discharging of capacitor 154. In one embodiment, the n-channel transistors are formed using a CMOS process. To charge capacitor 154, n-channel transistor 142 functions as a pass-gate switch which is coupled between VREF1 at 38 and the anode of capacitor 154 at line 148. When the "charge" input at 58 is switched to a logical "1", n-channel transistor 142 is turned on and couples capacitor 154 to VREF1 at 38 to initiate the charging of capacitor 154 to the VREF1 potential level. The cathode of capacitor 154 is coupled to ground at 156.

In various embodiments, capacitor 154 is formed through CMOS processes. In one embodiment, capacitor 154 is formed as a gate oxide capacitor. In other embodiments, capacitor 154 is a metal oxide capacitor or another suitable type of capacitor. In one embodiment, capacitor 154 has a capacitance value of 10 pF. In other embodiments, capacitor 154 has a value suitable for the particular geometries and feature sizes of the CMOS process and magnetic memory cell 14 being used.

When the selected memory cell 14 is desired to be written, write pulse generator 62 discharges capacitor 154 to switches 66 via a current reference current source which is used to limit the maximum peak value of the write current. Write control 52 terminates the charging of capacitor 154 by switching the charge output line at 58 to a logical "0", thereby turning off n-channel transistor 142. The discharge of capacitor 154 is initiated by switching the column write input at 56 of write control 52 to a logical "1", thereby turning on n-channel transistor 150 and coupling the anode of capacitor 154 to the input of a discharge control circuit at 166.

The discharge control circuit is illustrated in the exemplary embodiment as a current mirror current source which includes n-channel transistor 158 and n-channel transistor 160. In other embodiments, the discharge control circuit has other configurations. N-channel transistor 158 and n-channel transistor 160 are respectively coupled together in the exemplary embodiment as a first transistor and second transistor of the current mirror current source wherein the gates of n-channel transistors 158 and 160 are coupled together to a reference source at line 164. In FIG. 6a, the reference source is illustrated in the exemplary embodiment as a constant voltage source at line 164. In other embodiments, the reference source is a variable and controllable voltage source. In other embodiments, the reference source is a fixed current source or is a variable and controllable current source.

The peak discharge write current at output 68 of write pulse generator 62 is determined by suitably sizing n-channel transistor 158 relative to n-channel transistor 160. N-channel transistor 160 is coupled between the reference source at line 164 and the output 68 of write pulse generator 62 and conducts a reference current to output 68. N-channel transistor 158 is coupled between n-channel transistor 150 and the output at 68 and conducts the discharge current from capacitor 154 to the output 68. The gate width of n-channel transistor 158 is sized as a multiple of the gate width of n-channel transistor 160 so that a predetermined reference current through n-channel transistor 160 presets the maximum capacitor discharge current through n-channel transistor 158. N-channel transistor 160 has a width=w and n-channel transistor 158 has a width equal to αw, wherein α is any suitable number which is either greater than, equal to, or less than one. The current mirror formed by n-channel transistors 158 and 160 can thereby be used to control the write current to a specified range.

When capacitor 154 is discharged through n-channel transistor 158, the reference current through n-channel transistor 160 is combined at output 68 with the discharge current through n-channel transistor 158. The peak write current provided at output 68 is therefore equal to the current through n-channel transistor 160 plus α times the current through n-channel transistor 160. By selecting α to be a suitable number, the current at 68 is limited to a value high enough to switch the logic state of the selected magnetic memory cell 14, but still low enough so that other half-selected magnetic memory cells do not switch.

In other embodiments, other approaches can be used to charge the capacitor and couple the capacitor discharge current to bit line 18 and control the peak discharge current to bit line 18.

Figure 6B:
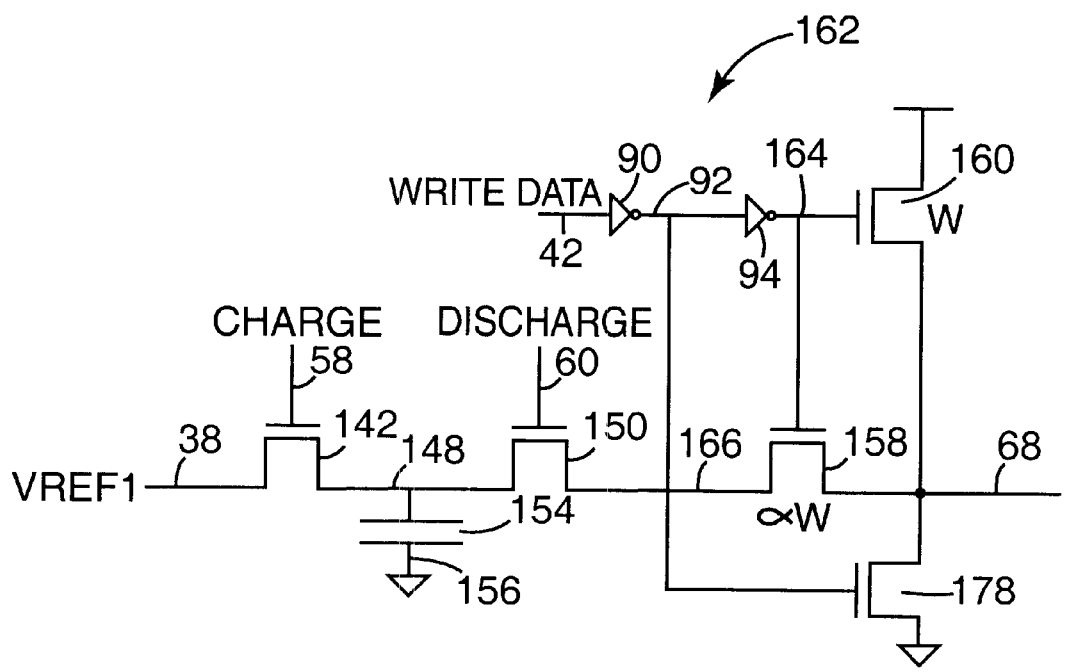
FIG. 6b is a schematic diagram illustrating a second exemplary embodiment of a write pulse generator circuit.

FIG. 6b is a schematic diagram illustrating a second exemplary embodiment of a write pulse generator circuit. Write pulse generator 162 is configured to be a bi-directional write driver and includes the circuit of FIG. 6a and additional control logic. When write pulse generator 162 is selected to supply the write current to bit line 18, write pulse generator 162 is configured in the current mirror configuration of the embodiment of FIG. 6a. When write pulse generator 162 sinks current rather than sourcing it, write pulse generator 162 switches the output at 68 to ground potential.

Write pulse generator 162 includes an inverter 90 which has as an input the write data input at 42 if write pulse generator 162 is being used in the column write drivers 32, or the inverted write data input at 74 if write pulse generator 162 is being used in column write drivers 34. In the exemplary embodiment illustrated in FIG. 6b, write pulse generator 162 is illustrated as being coupled to the write data input at 42.

In the embodiment illustrated in FIG. 6b, the output of inverter 90 is coupled to inverter 94 and a gate of n-channel transistor 178. The output of inverter 94 is coupled via line 164 to the gates of transistors 158 and 160. When the write data input on line 42 is at a logical "1", write pulse generator 162 is selected to supply the write current to bit line 18. N-channel transistor 178 is turned off and the output of inverter 94 is switched to a logical "1" thus switching the gates of n-channel transistors 158 and 160 to the voltage source level thereby allowing n-channel transistors 158 and 160 to function as a current mirror current source.

When write pulse generator 162 sinks current rather than sourcing it, the write data input on line 42 is switched to a logical "0". This turns off n-channel transistors 158 and 160 and turns on n-channel transistor 178, thus switching the output at line 68 to ground potential.

Figure 7:
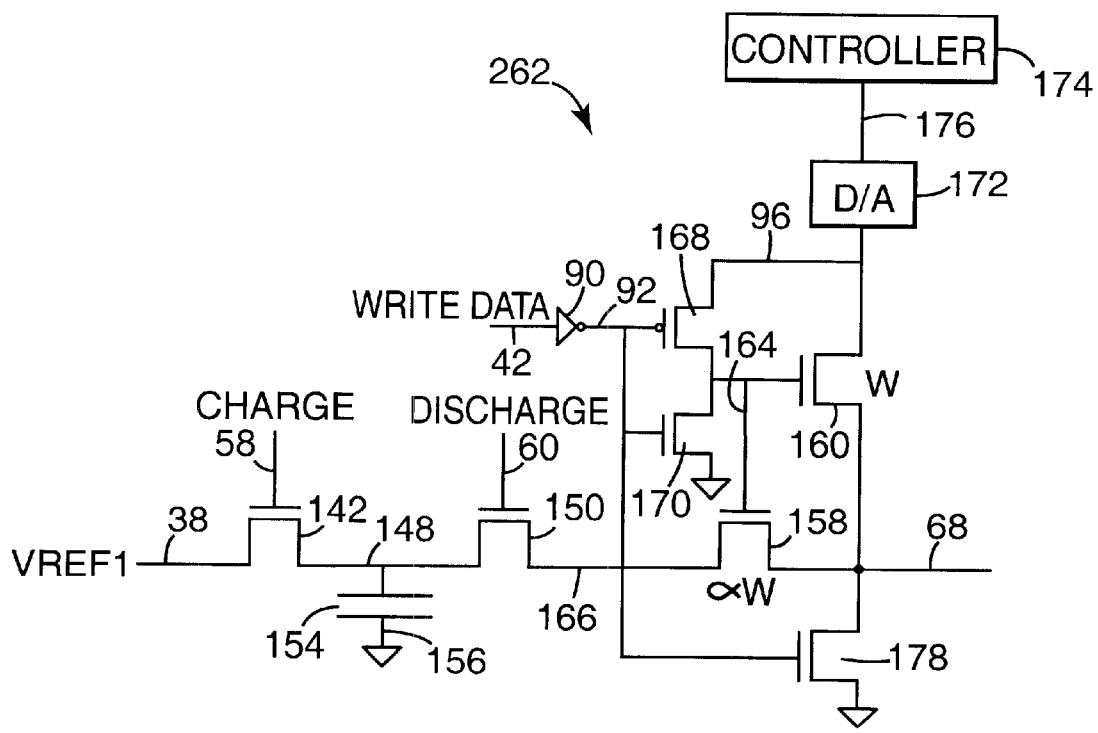
FIG. 7 is a schematic diagram illustrating a third exemplary embodiment of a write pulse generator circuit.

FIG. 7 is a schematic diagram illustrating a third exemplary embodiment of a write pulse generator circuit. Write pulse generator 262 is configured to be a bi-directional write driver and includes the circuit of FIG. 6b and a programmable current source.

In the embodiment illustrated in FIG. 7, line 96 is coupled to a programmable current source which provides the reference current to n-channel transistor 160. FIG. 7 illustrates the programmable current source as including digital-to-analog converter (D/A) 172 and controller 174. D/A 172 is coupled at line 176 to controller 174. Controller 174 and D/A 172 control the reference current provided from D/A 172 via line 96 through n-channel transistor 160. In one embodiment, controller 174 has a digital value that is stored by either an internal or external means relative to magnetic memory 10 and which represents a digital value of a desired current to be supplied through n-channel transistor 160.

When the write data input at 42 is at a logical "1", the write pulse generator 262 is selected to supply the write current. P-channel transistor 168 and n-channel transistor 170 together comprise an inverter wherein the p-channel transistor is coupled between line 96 and line 164 and the n-channel transistor is coupled between line 164 and ground potential. When the write data input at 42 is at a logical "1", n-channel transistor 170 is turned off and p-channel transistor 168 is turned on, thereby coupling the gates of n-channel transistors 158 and 160 to line 96 so that n-channel transistors 158 and 160 function as a current mirror current source. A digital value which is stored in controller 174 is converted by D/A 172 into a corresponding analog current and is supplied to n-channel transistor 160 via line 96. The peak write current provided at 68 is equal to the current through n-channel transistor 160 plus the discharge current through n-channel transistor 158 which is α times the current through n-channel transistor 160.

When write pulse generator 262 sinks current rather than sourcing it, the write data input on line 42 is switched to a logical "0". This turns off n-channel transistors 158 and 160 and turns on n-channel transistor 178, thus switching the output at line 68 to ground potential.

In other embodiments, other approaches can be used to set the current supplied to n-channel transistor 160 in order to control the peak write current provided at 68. In these other embodiments, the peak write current is equal to the current through n-channel transistor 160 plus α times the current through n-channel transistor 160.

In other embodiments, other approaches can be used to charge the capacitor and couple the capacitor discharge current to bit line 18 and control the peak discharge current to bit line 18.

Figure 8:
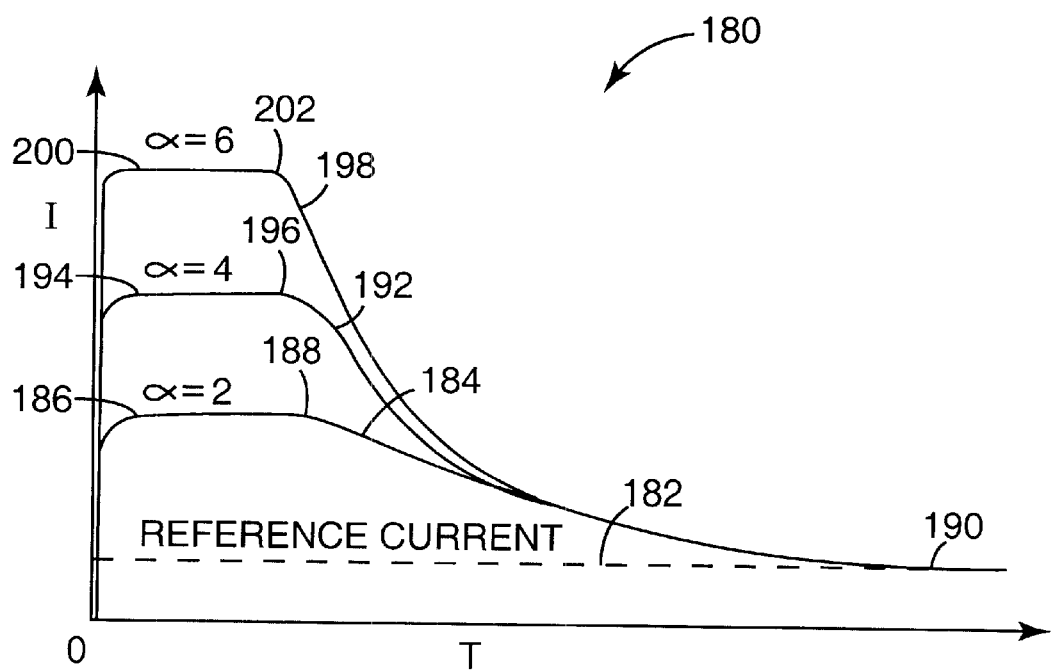
FIG. 8 is a diagram illustrating the discharge current versus time relationship for the exemplary embodiments of the write pulse generator circuits.

FIG. 8 is a diagram illustrating the discharge current versus time relationship at output 68 for the exemplary embodiments of the write pulse generator circuits. The current versus time relationship is shown generally at 180 and illustrates the time relationship of the capacitor discharge current pulse supplied to bit line 18 from write pulse generator 62. Time is illustrated on the horizontal axes and current is illustrated on the vertical axes.

When write control 52 initializes a discharge of the capacitor, the peak discharge endures for a time until the capacitor has been discharged. FIG. 8 illustrates three different current outputs for three exemplary embodiments which include three different ratios of current mirror transistors. The value of α represents the increase in the width of n-channel transistor 158 over the width of n-channel transistor 160.

The reference current through n-channel transistor 160 is represented at 182 as a dashed line. A current verses time relationship for α=2 is illustrated at 184. When α=2, the width of n-channel transistor 158 is two times the width of n-channel transistor 160. Therefore, the current through n-channel transistor 158, herein after referred to as the discharge transistor, is two times greater than the current through n-channel transistor 160, hereinafter referred to as the reference current transistor. The combined current output of the write pulse generator is equal to the discharge current plus the reference current after T=0. This is illustrated at 186. When α=2, the discharge transistor will supply twice the amount of current as the reference current transistor, and thus the peak current supplied to bit line 18 will be equal to the sum of the reference current and a value equal to two times the reference current, for a total value of three times the reference current. The discharge of the capacitor will continue until a point in time indicated at 188 upon which the charge stored within the capacitor has dropped to a level where the current through discharge transistor 158 is less than two times the reference current. The current supply to line 18 will stabilize at the reference current value as illustrated at 190.

When α=4, the current verses time relationship illustrated at 192 will have a peak value equivalent to five times the reference current at a time shortly after the discharge of the capacitor has begun as illustrated at 194. The discharge will continue until the point in time at which the capacitor can no longer supply the maximum current through the discharge transistor as indicated at 196, upon which the current supplied to bit line 18 will begin to drop until the current is equal to the value of the reference current as indicated at 190.

When α=6, the current verses time relationship illustrated at 198 will have a peak value equivalent to seven times the reference current at a time shortly after the discharge of the capacitor has begun as illustrated at 200. The discharge will continue until the point in time at which the capacitor could no longer supply the maximum current through the discharge transistor as indicated at 202, upon which the current supplied to bit line 18 will begin to drop until the current is equal to the value of the reference current as indicated at 190.

In one embodiment, values of α between two and six may be used depending on the particular geometries and feature sizes of the CMOS process and magnetic memory cell 14 being used. In other embodiments, other suitable values of α are used.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A magnetic memory comprising:
   a memory cell;
   a conductor which crosses the memory cell; and
   a write pulse generator coupled to the conductor configured to provide a discharge current to the conductor during a write operation of the memory cell,
   wherein the write pulse generator comprises:
      a capacitor which is charged to a first voltage reference potential to provide the discharge current; and
      a discharge control circuit coupled between the capacitor and the conductor for limiting the peak value of the discharge current provided to the conductor, wherein the discharge control circuit includes:
         a first transistor having a width W, wherein the first transistor is coupled between a reference source and the conductor for conducting a reference current to the conductor; and
         a second transistor having a width αW, wherein the second transistor is coupled between the capacitor and the conductor for conducting the discharge current from the capacitor to the conductor, wherein the first and second transistors each have a gate coupled to the reference source to limit the discharge current to the peak value of α times the reference current through the first transistor.

2. The magnetic memory of claim 1, wherein the reference source is a programmable current source which provides a reference current to the first transistor.

3. The magnetic memory of claim 2, wherein the programmable current source includes:
   a controller for storing a digital value corresponding to the reference current; and
   a digital-to-analog converter coupled between the controller and the first transistor for converting the digital value into the reference current.

4. The magnetic memory of claim 1, wherein the reference source is a voltage source.

5. A magnetic memory comprising:
   an array of memory cells;
   an array of bit lines extending in a first direction which intersects the array of memory cells;
   an array of word lines extending in a second direction which intersects the array of memory cells; and
   a column write driver coupled to the bit lines, wherein the column write driver provides a discharge current to a selected bit line intersecting a selected memory cell, and wherein the discharge current is limited to a peak value, wherein the column write driver includes:
      a capacitor which is charged to a first voltage reference potential level to provide the discharge current; and
      a discharge control circuit coupled to the capacitor for limiting the peak value of the discharge current provided to the selected bit line; and select switches coupled between the discharge control circuit and the array of bit lines for conducting the discharge current to the selected bit line, wherein each select switch corresponds to a bit line, and wherein the select switches either couple the discharge control circuit to the selected bit line, or apply a second reference voltage to the unselected bit lines during a write operation.

6. The magnetic memory of claim 5, wherein the second reference voltage is zero volts.

7. The magnetic memory of claim 5, wherein the discharge control circuit includes:
a first transistor having a width W, wherein the first transistor is coupled between a reference source and the select switches for conducting a reference current to the selected bit line; and
a second transistor having a width $\alpha$W, wherein the second transistor is coupled between the capacitor and the select switches for conducting the discharge current from the capacitor to the selected bit line, wherein the first and second transistors each have a gate coupled to the reference source to limit the discharge current to the peak value of $\alpha$ times the reference current through the first transistor.

8. The magnetic memory of claim 7, wherein the reference source is a programmable current source which provides a reference current to the first transistor.

9. The magnetic memory of claim 8, wherein the programmable current source includes:
a controller for storing a digital value corresponding to the reference current; and
a digital-to-analog converter coupled between the controller and the first transistor for converting the digital value into the reference current.

10. The magnetic memory of claim 7, wherein the reference source is a voltage source.

11. A magnetic memory comprising:
one or more magnetic memory cells;
one or more first conductors and second conductors which cross the magnetic memory cells, wherein each magnetic memory cell is intersected by a first conductor and a second conductor; and
means for providing a discharge write current to a selected one or the one or more first conductors during a write operation,
wherein the means for providing a discharge write current includes:
a capacitor which is charged to a first voltage reference potential to provide the discharge current; and
means for limiting the peak value of the discharge current provided by the capacitor to the selected one of the one or more first conductors,
wherein the means for limiting the peak value of the discharge current includes:
a first transistor having a width W, wherein the first transistor is coupled between a reference source and the one of the one or more first conductors for conducting a reference current to the selected one of the one or more first conductors; and
a second transistor having a width $\alpha$W, wherein the second transistor is coupled between the capacitor and the one or more first conductors for conducting the discharge current from the capacitor to the selected one of the one or more first conductors, wherein the first and second transistors each have a gate coupled to the reference source to limit the discharge current to a peak value of $\alpha$ times the reference current through the first transistor.

12. The magnetic memory of claim 11, wherein the reference source is a programmable current source which provides a reference current to the first transistor.

13. The magnetic memory of claim 12, wherein the programmable current source includes:
a controller for storing a digital value corresponding to the reference current; and
a digital-to-analog converter coupled between the controller and the first transistor for converting the digital value into the reference current.

14. The magnetic memory of claim 11, wherein the reference source is a voltage source.

15. A method of providing a discharge write current to a selected magnetic memory cell during a write operation, the method comprising:
charging a capacitor to a first voltage reference potential; and
discharging the capacitor to a conductor which intersects the selected memory cell while limiting the peak value of the discharge current, further comprising:
conducting a reference current from a reference source to the conductor through a first transistor having a width W; and
discharging the capacitor to the conductor through a second transistor having a width $\alpha$W, wherein the first and second transistors each have a gate coupled to the reference source to limit the discharge current to a peak value of $\alpha$ times the reference current through the first transistor.

16. The method of claim 15, further comprising:
providing a digital value corresponding to the reference current to a controller; and
converting the digital value into the reference current and providing the reference current to the first transistor.

* * * * *